US009013695B2

(12) United States Patent
Nakamoto

(10) Patent No.: US 9,013,695 B2
(45) Date of Patent: Apr. 21, 2015

(54) PROJECTION ALIGNER

(75) Inventor: Yuken Nakamoto, Tokyo (JP)

(73) Assignee: ORC Manufacturing Co., Ltd., Tokyo (JP)

(*) Notice: Subject to any disclaimer, the term of this patent is extended or adjusted under 35 U.S.C. 154(b) by 150 days.

(21) Appl. No.: 13/814,403

(22) PCT Filed: Jun. 23, 2011

(86) PCT No.: PCT/JP2011/064415
§ 371 (c)(1),
(2), (4) Date: Mar. 5, 2013

(87) PCT Pub. No.: WO2012/035843
PCT Pub. Date: Mar. 22, 2012

(65) Prior Publication Data
US 2013/0155398 A1  Jun. 20, 2013

(30) Foreign Application Priority Data
Sep. 13, 2010  (JP) ................................. 2010-204715

(51) Int. Cl.
*G03F 7/20* (2006.01)
*G03F 9/00* (2006.01)
*G01B 11/14* (2006.01)
*G01B 11/27* (2006.01)

(52) U.S. Cl.
CPC ............ *G03F 7/7055* (2013.01); *G03F 9/7011* (2013.01); *G03F 9/7015* (2013.01); *G01B 11/14* (2013.01); *G01B 11/27* (2013.01)

(58) Field of Classification Search
None
See application file for complete search history.

(56) References Cited

U.S. PATENT DOCUMENTS

| 5,331,371 | A  | * | 7/1994  | Mori et al. ................... 355/53 |
| 5,760,881 | A  | * | 6/1998  | Miyazaki et al. ............. 355/71 |
| 6,680,774 | B1 | * | 1/2004  | Heinle ........................... 355/72 |
| 6,771,352 | B2 | * | 8/2004  | Dierichs ........................ 355/67 |
| 7,659,965 | B2 | * | 2/2010  | Liu ................................ 355/74 |
| 7,777,863 | B2 | * | 8/2010  | Smeets et al. ................ 355/74 |
| 2007/0258076 | A1 | * | 11/2007 | Maria Derksen et al. ... 355/67 |
| 2008/0252871 | A1 | * | 10/2008 | Sato et al. ..................... 355/66 |

FOREIGN PATENT DOCUMENTS

| JP | 04133308 A  | * | 5/1992 |
| JP | 8-115872    |   | 5/1996 |
| JP | 10092732 A  | * | 4/1998 |
| JP | 2004128295 A| * | 4/2004 |

(Continued)

*Primary Examiner* — Gordon J Stock, Jr.
(74) *Attorney, Agent, or Firm* — Berenato & White, LLC

(57) ABSTRACT

A projection aligner comprises a projection optical system for radiating a luminous flux including ultraviolet rays onto a photomask, and projecting said luminous flux which has passed through the photomask onto a substrate to which photoresist is applied; a substrate table for mounting the substrate, and a light blocking means for covering the peripheral portion of the substrate to block luminous flux. The light blocking means (80) includes a first light blocking member (84) and a second light blocking member (86) each having a substantially semicircular opening, and moving means (82, 83) for moving the first light blocking means and the second light blocking means approaching each other and away from each other. As the first light blocking member and the second light blocking member are moved to approach each other, the first light blocking member and the second light blocking member form an annular shape and cover the peripheral portion of the substrate (CB).

7 Claims, 13 Drawing Sheets

(56) References Cited

FOREIGN PATENT DOCUMENTS

| | | |
|---|---|---|
| JP | 2005-45160 | 2/2005 |
| JP | 2005-505147 | 2/2005 |
| JP | 2006-40915 | 2/2006 |
| JP | 2007-318121 | 12/2007 |
| JP | 2008-258623 | 10/2008 |
| JP | 2008-300836 | 12/2008 |
| JP | 2009105183 A * | 5/2009 |
| JP | 2009239018 A * | 10/2009 |
| KR | 2005059908 A * | 6/2005 |

* cited by examiner

PROJECTION ALIGNER

FIELD OF THE INVENTION

The present invention relates to a projection aligner with a light blocking device to block light on the edges of a substrate to which a photoresist has been applied while a predetermined pattern is formed on the surface of the substrate, e.g., of silicon by exposure.

BACKGROUND OF THE INVENTION

Photoresists are applied to substrates for semiconductors, e.g., silicon wafers, glass substrates for flat displays or kinds of substrates for electric circuits (hereinafter called substrate) but photoresists may not be uniform on the edges of the substrates. Due to this, the photoresist is not removed and remained on the edges and may cause the dust in the proceeding process. Therefore, the photoresist needs to be removed from the edges of the substrate before the process proceeds.

A negative-type photoresist is used in an electrode forming process of a plate process, and a positive-type photoresist is used to prevent resist film at the peripheral portion from separation.

Japan unexamined patent publication No. 2005-505147 discloses an apparatus having a ring-shaped light blocking body placing on a substrate to cover whole edges of the substrate. Since the light blocking body discloses in the publication No. 2005-505147 has a shape to cover whole edges of the substrate, when the substrate is loaded or unloaded, the substrate table is required to be moved to move the light blocking means in the waiting position so that the light blocking means is removed. Thereafter, the substrate table is moved to the substrate loading position and the substrate is changed, and the substrate table is moved to the waiting position to place the light blocking body on the substrate. Therefore, the moving distance of the substrate table is long, so that it takes time to load and unload the substrate. Moreover, the light blocking body is moved frequently, which causes the high possibility of dust filling up.

Japan unexamined patent publication No. 2005-045160 discloses a technique of an arc-shaped light blocking unit or a rectangular light blocking unit being placed near the edges of the wafer not to expose the peripheral region of the substrate. This technique requires the mechanism of moving the light blocking unit around the substrate and the mechanism of calculating and controlling the light blocking position.

Patent publication 1: Japan unexamined patent publication No. 2005-505147
Patent publication 2: Japan unexamined patent publication No. 2005-045160

SUMMARY OF THE INVENTION

Since the light blocking body covering the whole surface of the substrate as disclosed in the patent publication 1 increases in size, it takes time to load and unload the substrate, which lowers the processing ability of projection aligner. The light blocking unit disclosed in the patent publication 2 is small and handled easier but the control unit of the light blocking unit needs to calculate the insert position of the light blocking unit depending on the pattern drawn on the photomask in advance, so that the processing becomes complicated.

Therefore, the present invention provides a projection aligner utilizing a light blocking means so as to shorten time required for setting and removing the light blocking means during substrate conveyance. Further, the light blocking means can be applied for a variety of light blocking regions of the substrates.

A projection aligner of the first aspect of the present invention comprises a projection optical system for radiating a luminous flux including ultraviolet rays onto a photomask, and projecting the luminous flux which has passed through the photomask onto a substrate to which a photoresist is applied; a substrate table for mounting the substrate; and a light blocking means for covering peripheral portion of the substrate to block luminous flux. The light blocking means includes a first light blocking member and a second light blocking member each have a substantially semicircular opening; and moving means for moving the first light blocking member and the second light blocking member so as to approach each other and be away from each other. Accordingly, as the first light blocking member and the second light blocking member approach each other, the first light blocking member and the second light blocking member form an annular shape and cover the peripheral portion of the substrate.

In a projection aligner of the second aspect of the present invention, the first light blocking member and the second light blocking members each comprise a removable first light blocking blade and a removable second light blocking blade for blocking the illumination flux, respectively, and a first light blocking base and a second light blocking base provided with the first light blocking blade and the second light blocking blade, respectively. The first light blocking base and the second light blocking base are connected to the moving means and connected to a lifting means for moving the first light blocking base and the second light blocking base up and down.

In a projection aligner of the third aspect of the present invention, the first light blocking blade and the second light blocking blade each have a distal end of thin portion so as to overlap each other in thickness direction as the first light blocking blade and the second light blocking blade approach each other.

In a projection aligner of the fourth aspect of the present invention, the substrate is loaded on the substrate table by a substrate conveyance means, and the moving means moves the first light blocking member and the second light blocking member so as to be moved straight in parallel with the direction where the accuracy of positioning is lower than the other directions.

In a projection aligner of the fifth aspect of the present invention, at least one of the first light blocking member and the second light blocking member is fixed at a rotary shaft at an end thereof, and the moving means moves at least one of the first light blocking member and the second light blocking member in a rotating direction.

A projection exposure method of the sixth aspect of the present invention radiates a luminous flux including ultraviolet rays onto a photomask, blocks the luminous flux having passed through the photomask at the peripheral portion of the substrate applied with a photoresist by light blocking means covering the peripheral portion of the substrate so that the peripheral portion of the substrate applied with a photoresist is not irradiated with the luminous flux but the central portion where the center side from the peripheral portion is radiated. The projection exposure method comprises a step of mounting the substrate on a substrate stage by a substrate convey means, a step of arranging the light blocking means above and closer to the substrate, a step of calculating a position of the substrate mounted on the substrate stage and a position of the light blocking means, and a step of in a case of the position of the light blocking means respect to the position of the substrate displaced out of the range of the predetermined range, moving the light blocking means so that the displacement is within the predetermined range.

In a projection exposure method of the seventh aspect of the present invention, the position of the substrate is calculated by measuring several alignment marks, and the position of light blocking means is calculated by measuring at least one alignment mark provided at the light blocking means.

According to the projection aligner of the present invention, the projection aligner comprises the separated first light blocking member and second light blocking member, so that the setting and unsetting of the light blocking means can easily be processed during the substrate loading or unloading.

DETAILED DESCRIPTION OF INVENTION

<Schematic Constitution of Protection Aligner 100>

Figure 1:
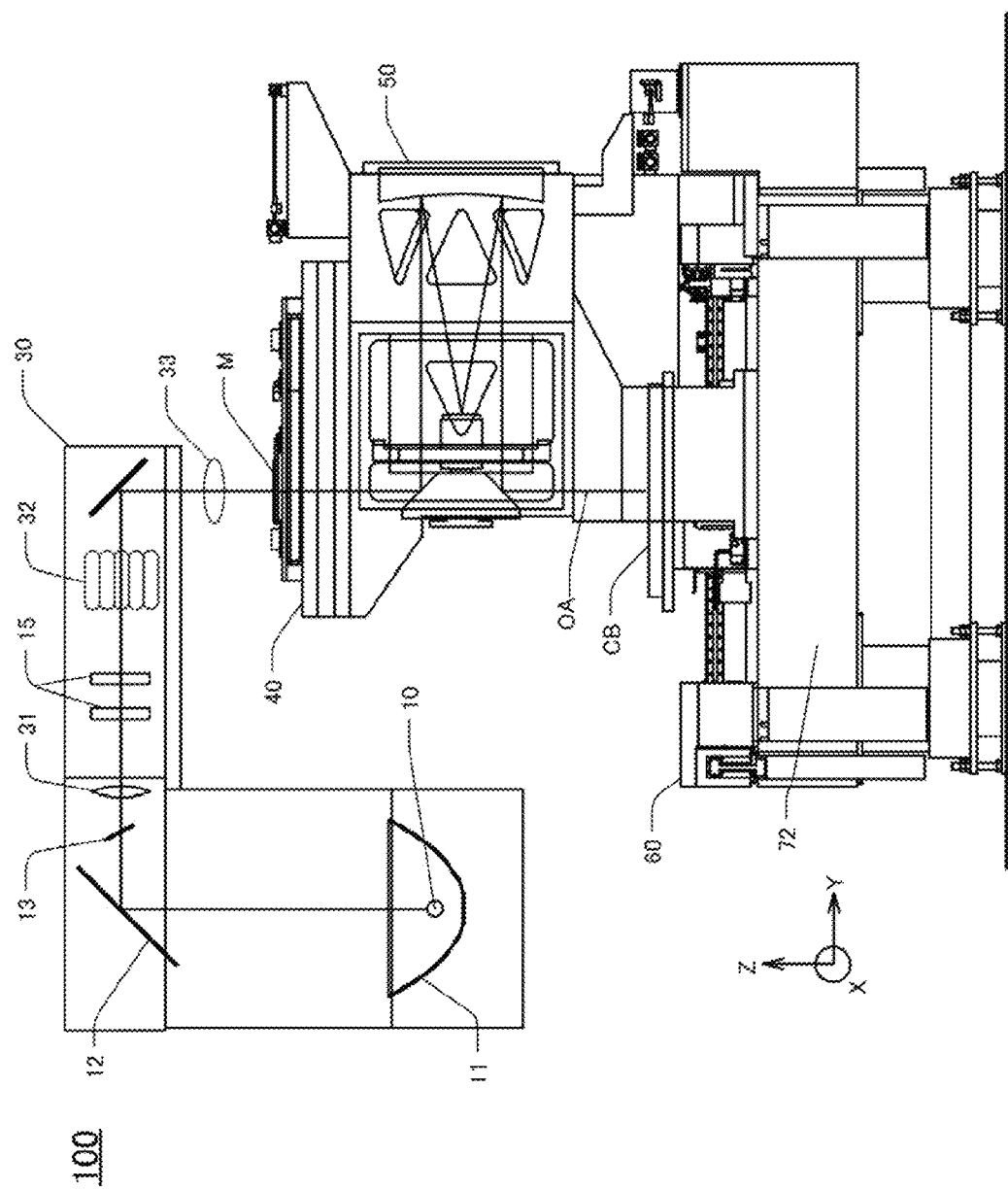
FIG. 1 is a schematic side view of a projection aligner 100.

FIG. 1 is a schematic side view of a projection aligner 100.

The projection aligner 100 substantially includes: a light source 10 which radiates a luminous flux of a wavelength range containing ultraviolet rays; an illumination optical system 30 which converges a luminous flux from the light source 10; a mask stage 40 which holds a photomask H; a projection optical system 50; and a substrate stage 60.

The projection aligner 100 includes the illumination optical system 30 for uniformly illuminating the photomask M which is supported on the mask stage 40 parallel to an X-Y plane. The illumination optical system 30 includes the light source 10 which is formed of a mercury short arc lamp similar to a positional light source, for example. The light source 10 is arranged at a first focal point of an elliptical mirror 11 and hence, an illumination luminous flux radiated from the light source 10 forms a light source image at a second focal point of the elliptical mirror via a dichroic mirror 12. The dichroic mirror 12 does not reflect light other than light within a predetermined wavelength range. Here, the light source 10 which the illumination optical system 30 includes may be an ultraviolet-irradiation-type LED (Light Emitting Diode) or a laser.

Exposure light which reaches a substrate CB is blocked by a shutter 13. Diverging light from a light source image is converted into a parallel luminous flux by a collimate lens 31 and, thereafter, is incident on a wavelength selection part 15. The wavelength selection part 15 is constituted such that the wavelength selection part 15 can be inserted into or removed from an optical path formed between the light source 10 and the photomask M.

A fly-eye lens 32 is arranged at the second focal point of the elliptical mirror. A luminous flux which passes through the wavelength selection part 15 passes through the fly-eye lens 32 and a condenser lens 33 sequentially.

The luminous flux which passes through the wavelength selection part 15 is incident on the fly-eye lens 32. The fly-eye lens 32 is constituted such that a large number of positive lens elements are densely arranged in a matrix array in a state where a center axis of each positive lens element extends along an optical axis OA. Accordingly, the luminous flux which is incident on the fly-eye lens 32 is divided by the large number of lens elements by wavefront dividing thus forming secondary light sources which is formed of light sources the number of which is equal to the number of lens elements on a rear focal plane of the fly-eye lens 32 (that is, in the vicinity of an irradiation surface of the fly-eye lens 32).

A luminous flux from the large number of secondary light sources formed on the rear focal plane of the fly-eye lens 32 is incident on the condenser lens 33. The luminous flux which passes through the condenser lens 33 illuminates the patterned photomask M in a superposed manner. The luminous flux which illuminates the photomask M by exposure light and passes through the photomask M advances toward the projection optical system 50 and, thereafter, is radiated to the substrate CB which is an object to be exposed.

Figure 2:
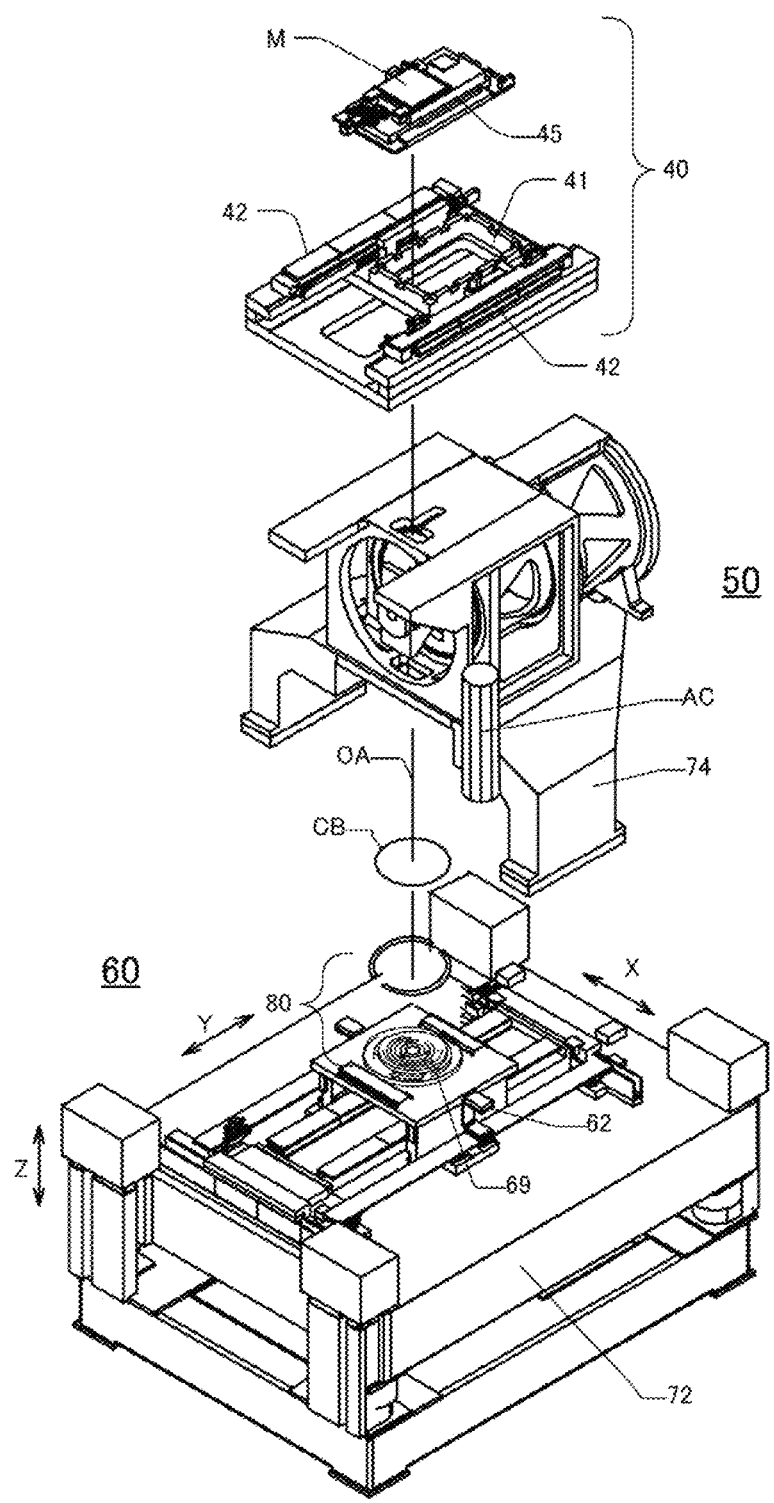
FIG. 2 is a schematic perspective view of the reflection-type exposure device 100 from which the illumination optical system 30 is excluded.

FIG. 2 is a schematic perspective view of the reflection-type exposure device 100 from which the illumination optical system 30 is excluded, wherein the mask stage 40, the reflection-type projection optical system 50 and the substrate stage 60 are shown in an exploded manner. The substrate stage 60 is shown in a state where a first light blocking device 80 is mounted on the substrate stage 60.

The mask stage 40 includes a Y stage 41 for moving the photomask M along the Y-axis direction which is the scanning direction. The Y stage 41 is driven at a high speed and with high accuracy by linear motors 42 which are arranged on both sides of the Y stage 41 respectively. An X$\theta$ stage 45 which moves in the X-axis direction and in the direction rotated by $\theta$ with respect to a Z axis is mounted on the Y stage 41.

The projection optical system 50 is a reflection-type projection optical system which is referred to as an Ophner type reflection-type projection optical system. The projection optical system 50 is supported on a support base 74. On the reflection-type projection optical system 50, in addition to a reflection mirror, a fixed mirror which performs the measurement using a laser interferometer is mounted. A catadioptric Dyson-type projection optic system or a refraction-type projection optical system may be used in place of the Ophner type projection optical system.

The substrate stage 60 is arranged on an upper surface of a base 72. The substrate stage 60 includes XY stages 62 which are movable in the XY scanning directions. The substrate stage 60 is also configured to be movable in the Z axis direction in the same manner as the mask stage 40. The XY stages 62 are driven at a high speed and with high accuracy by linear motors arranged on both sides of the XY stages 62.

The substrate table 60 includes a vacuum chuck 69 which sucks the substrate CB. The term "substrate CB" covers an electronic printed circuit board, a glass substrate for a liquid crystal element, or a glass element substrate for a PDP, for example. The vacuum chuck 69 is formed using ceramic, and the vacuum chuck 69 can hold the substrate CB by sucking using a vacuum pump not shown in the drawing. The substrate table 60 is movable also in the Z axis direction. Due to such a constitution, a luminous flux which is reflected on the Ophner type reflection-type projection optical system 50 is incident on the substrate CB and forms an image on the substrate CB. That is, a patterned image of the photomask M is formed on the substrate CB, and this image is transferred onto the substrate CB by a photoresist applied to the substrate CB.

An alignment camera AC is mounted on the support base 74 which supports the projection optical system 50 thereon. The alignment camera AC detects an alignment mark formed on the substrate CB. The alignment camera AC also detects a blade alignment mark formed on a light blocking blade described later.

The substrate table 60 includes a first light blocking device 80 around the vacuum chuck 69. The first light blocking device 80 can shield a peripheral portion of the substrate CB which is held by the vacuum chuck 69 from light. The first light blocking device 80 is mounted on the substrate stage 60. Accordingly, the first light blocking device 80 is movable in the X-axis direction, in the Y-axis direction and in the Z axis direction with respect to the optical axis OA of the projection optical system 50.

<Schematic Constitution of First Light Blocking Device 80>

Figure 3:
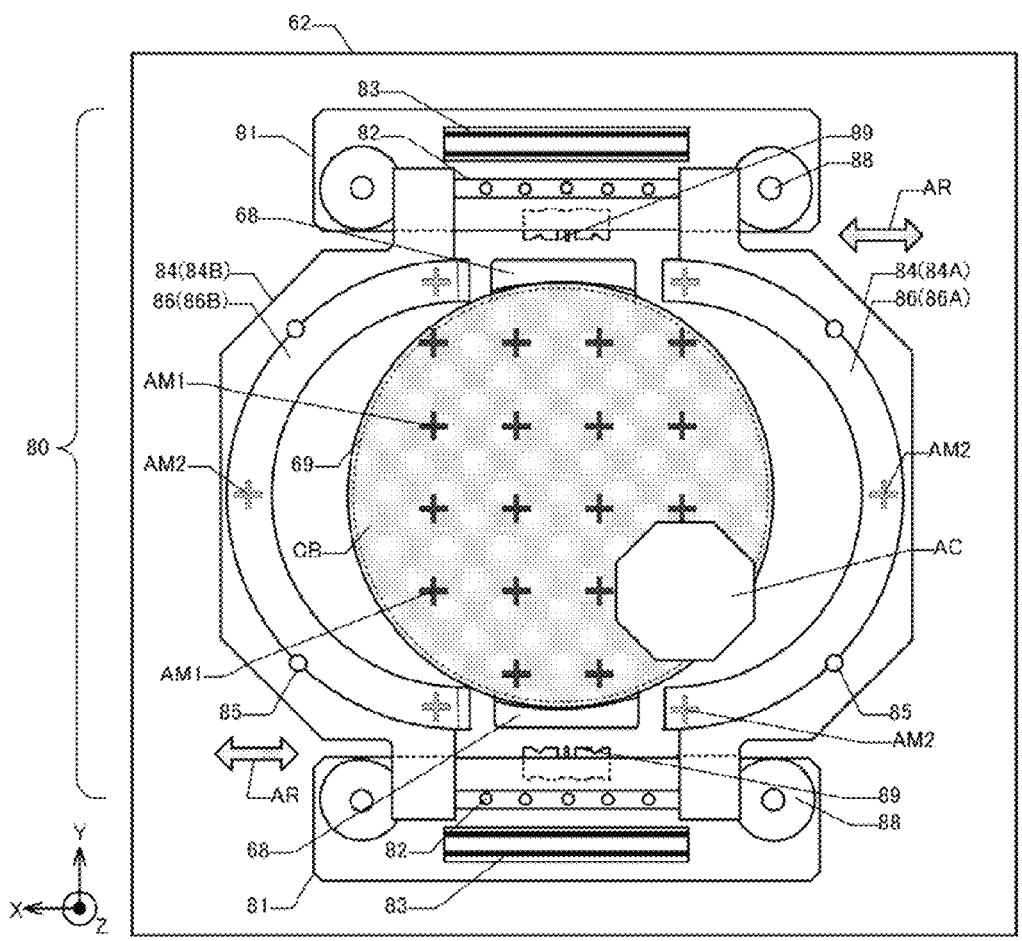
FIG. 3 is a plan view of a first light blocking device 80 as viewed in the Z-axis direction.

FIG. 3 is a plan view of the XY stages 62 and the first light blocking device 80 as viewed in the Z axis direction. FIG. 3 shows a state where the substrate CB is placed on the vacuum chuck 69, and light blocking blades 86 of the first light blocking device 80 described later are opened.

The vacuum chuck 69 is arranged at the approximately center of the XY plane on the XY stages 62. A pair of substrate lifters 68 is arranged in the Y-axis direction in a state where the pair of substrate lifters 68 sandwiches the vacuum chuck 69 therebetween. The substrate lifters 68 move the substrate CB in the vertical direction (Z-axis direction) at the time of loading or unloading the substrate CB.

Moving bases 81 of the moving device are arranged outside the pair of substrate lifters 68 in the Y-axis direction respectively. A moving guide 82 and an actuator 83 such as a drive motor are arranged on each moving base 81. Lifting guides 88 are arranged on both sides of the moving base 81 in the X-axis direction, and a lifting actuator 89 is arranged at the approximately center of the moving base 81. The lifting guides 88 and the lifting actuator 89 are provided for elevating or lowering the moving base 81 in the Z axis direction.

A pair of light blocking bases 84 (84A, 84B) is mounted on the pair of moving guides 82 and the actuators 83. A pair of light blocking blades 86 (86A, 86B) is mounted on the pair of light blocking bases 84 respectively. Positioning pins 85 are mounted on the light blocking base 84. The light blocking blade 86 includes a semicircular opening portion which conforms to, for example, the size of the substrate CB such as 6 inches or 8 inches or a size of a light blocking area. The light blocking blades 86 which differ in size or shape depending on a usage are suitably mounted on or removed from the light blocking base 84. The positioning pins 85 are used for positioning the light blocking blade 86 at the time of mounting the light blocking blades 86 on the light blocking base 84.

The light blocking blade 86A and the light blocking blade 86B approach each other or are moved away from each other as indicated by an arrow AR along with the movement of the moving guides 82 and the actuator 83 in the X-axis direction. When the light blocking blade 86A and the light blocking blade 86B approach each other, the light blocking blade 86A and the light blocking blade 86B form an annular shape and cover the peripheral portion of the substrate CB.

In general, alignment marks AM1 are formed on the substrate CB by exposure. A blade-use alignment mark AM2 is also formed on the light blocking blades 86. When the XY stages 62 move in the XY-axis directions, the alignment marks AM1 or the blade-use alignment marks AM2 move to an area directly below the alignment camera AC. The alignment camera AC performs the global alignment where the extension and the shrinkage of the whole substrate CB or the position of the substrate CB is measured by imaging three to ten and several alignment marks AM1. At this point of time, the alignment camera AC can also calculate the center position of the substrate CB on the XY plane. Further, the alignment camera AC confirms positions of the light blocking blade 86A and the light blocking blade 86B by imaging the blade-use alignment marks AM2.

<Direction of Conveyance (Loading and Unloading) of Substrate using Conveyance Arm>

Figure 4:
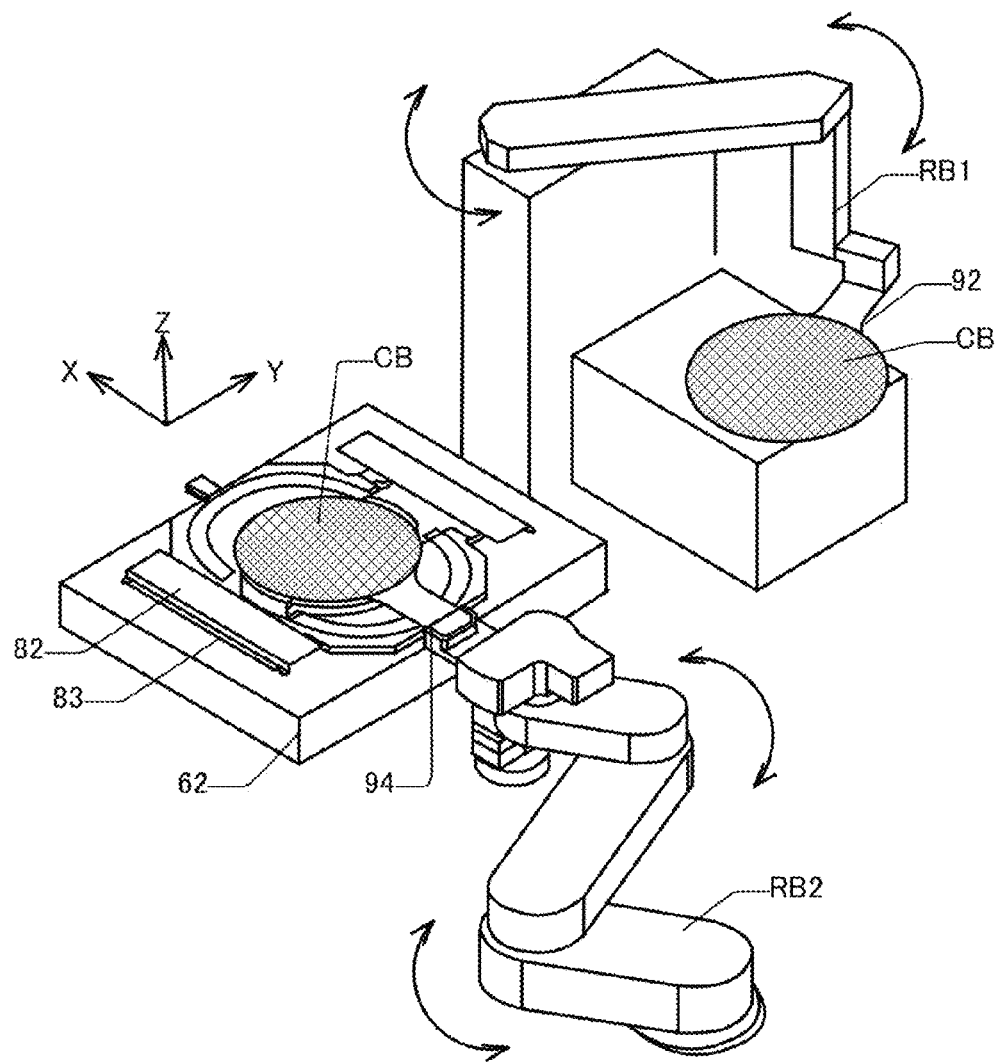
FIG. 4 is a perspective view showing a state where the substrate CB is loaded by a conveyance arm.

FIG. 4 is a perspective view showing a state where the substrate CB is placed on the vacuum chuck 69 of the substrate table 60 by the conveyance arm. In FIG. 4, a conveyance robot RB1 and a conveyance robot RB2 convey the substrate CB.

Both the conveyance robot RB1 and the conveyance robot RB2 are formed of a so-called scalar-type conveyance robot which includes a plurality of rotational axes. A conveyance arm 92 having a distal end on which the substrate CB is placed is mounted on the conveyance robot RB1, and a conveyance arm 94 having a distal end on which the substrate CB is placed is mounted on the conveyance robot RB2. The conveyance arms 92, 94 hold the substrate CB by sucking such as vacuum sucking. Although it is not always necessary to provide two conveyance robots, for example, the conveyance robot RB1 plays a role of loading the substrate CB in the vacuum chuck 69, and the conveyance robot RB2 plays a role of unloading the substrate CB from the vacuum chuck 69.

Here, assume that the conveyance robot RB has the positioning accuracy of ±2 mm in the X-axis direction with respect to the vacuum chuck 69, and has the positioning accuracy of ±1 mm in the Y-axis direction with respect to the vacuum chuck 69. That is, the conveyance robot RB1 is liable to be displaced in the X-axis direction compared to in the Y-axis direction. Accordingly, there exists a high possibility that the substrate CB is displaced in the X-axis direction with respect to the center position of the vacuum chuck 69.

Here, the moving guide 82 and the actuator 83 are arranged to be movable in the X-axis direction. Although the conveyance robot RB1 is liable to be displaced in the X-axis direction compared to in the Y-axis direction, such displacement can be minimized by such movement of the guides 82 and the actuator 83 in the X-axis direction.

<Manner of Operation of First Light Blocking Device 80>

Figure 5:
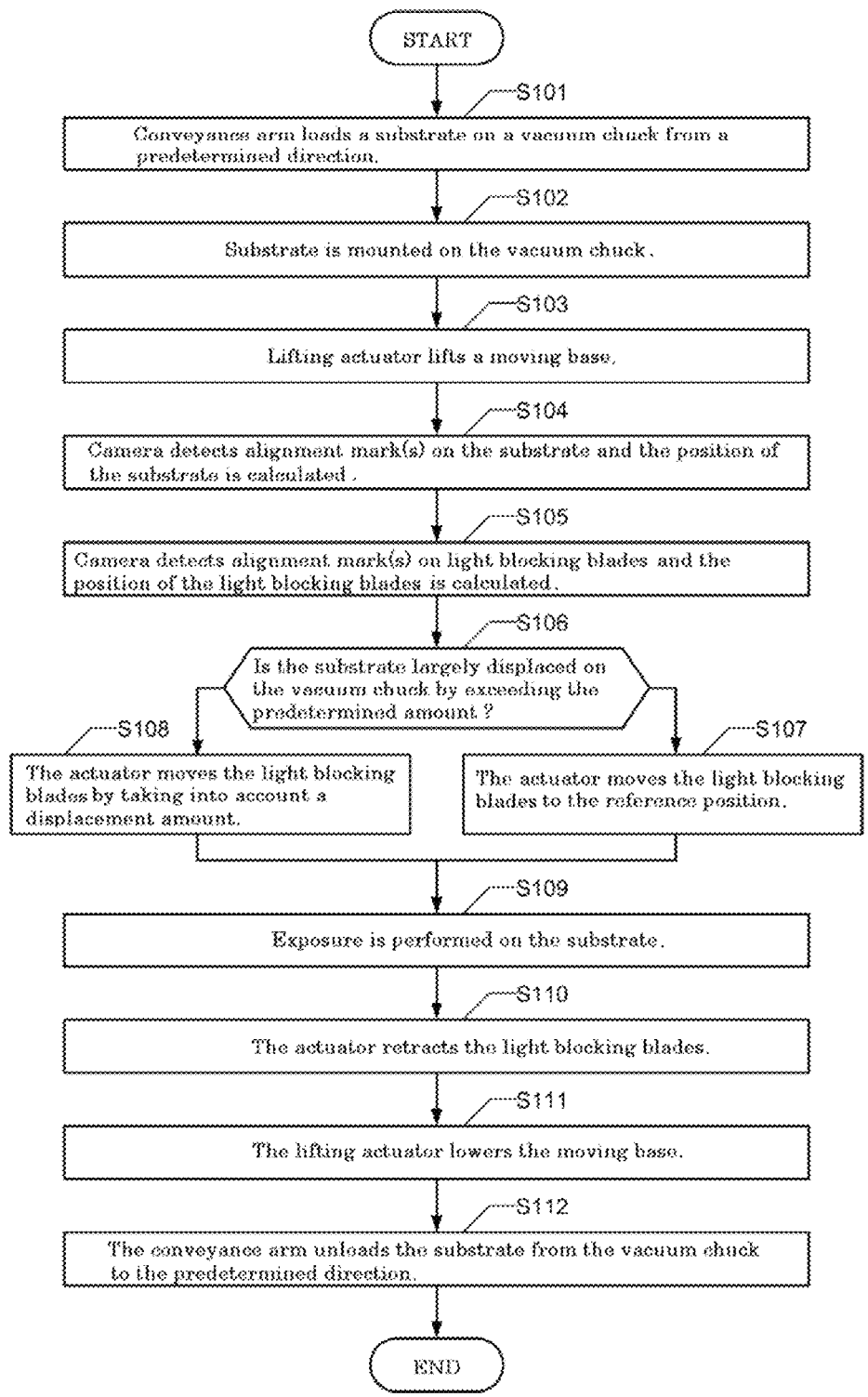
FIG. 5 is an operation flowchart of the first light blocking device 80.
Figure 6A:
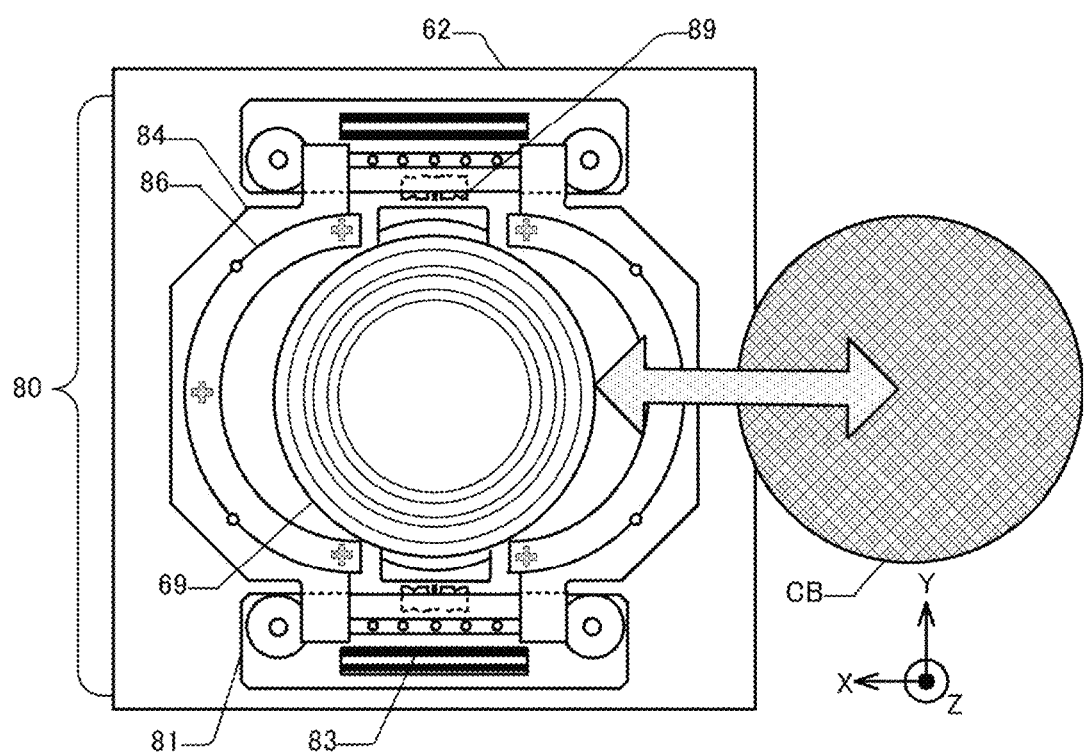
FIG. 6A is a view showing a state where the substrate CB is loaded on or is unloaded from a vacuum chuck 69.
Figure 6B:
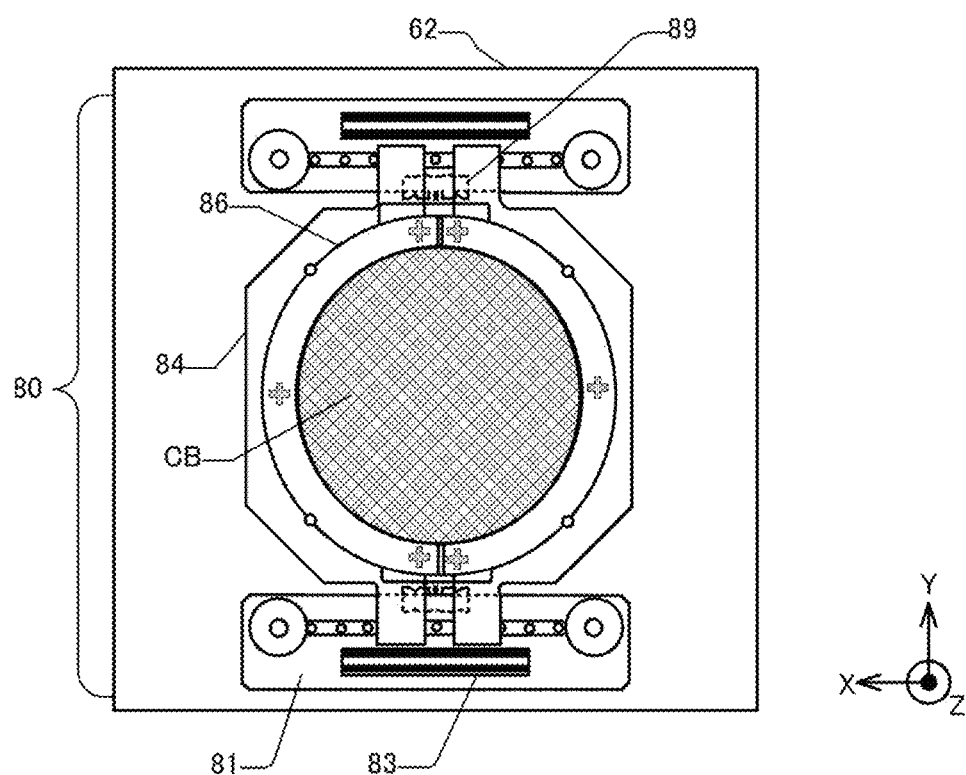
FIG. 6B is a view showing a state where the peripheral portion of the substrate CB is covered with the light blocking blades 86.

FIG. 5 is an operation flowchart of the first light blocking device 80. The manner of operation of the first light blocking device 80 is explained in conjunction with FIG. 6. FIG. 6A is a view showing a state where the substrate CB is loaded on or is unloaded from the vacuum chuck 69. FIG. 6B is a view showing a state where the peripheral portion of the substrate CB is covered with the light blocking blades 86.

In step S101, the conveyance arm 92 (see FIG. 4) loads the substrate CB on the vacuum chuck 69 from the X-axis direction. In this embodiment, assume that the positioning accuracy of the conveyance arm 92 in the X-axis direction is lower than the positioning accuracy of the conveyance arm 92 in the Y-axis direction. Accordingly, the moving guide 82 and the actuator 83 which are arranged on the moving base 81 are arranged to be movable in the X-axis direction. Further, at the time of loading the substrate CB, the light blocking blades 86 are in an open state, and the moving base 81 is in a lowered state. A state shown in FIG. 6A is a state taken in step S101.

In step S102, the conveyance arm 92 loads the substrate CB on the vacuum chuck 69 from the X-axis direction. Here, the substrate lifter 68 is in an elevated state, and the substrate CB is transferred from the conveyance arm 92 to the substrate lifter 68. Then, the substrate lifter 68 is lowered and the substrate CB is placed on the vacuum chuck 69. Thereafter, the vacuum chuck 69 holds the substrate CB by vacuum chucking so that the substrate CB is fixed. After finishing the transfer of the substrate CB, the conveyance arm 92 retracts.

In step S103, the moving base 81 is elevated in the Z axis direction by the lifting guides 88 and the lifting actuator 89. Then, the moving base 81 is moved to a height approximately equal to a height of the substrate CB in the Z axis direction.

In step S104, the alignment camera AC images approximately three to ten and several alignment marks AM1 on the substrate CB. It is not always necessary to image all alignment marks AM1. Then, positions of respective shots exposed on the substrate CB or the like are calculated, and the center position of the substrate CB is calculated.

In step S105, the alignment camera AC images the blade-use alignment marks AM2 on the light blocking blade 86A and the light blocking blade 86B. Then, positions of the light blocking blade 86A and the light blocking blade 86B are calculated. A height of the substrate CB in the Z axis direction and a height of the light blocking blades 86 in the Z axis direction are approximately equal and hence, the alignment camera AC can image the alignment marks AM1 and the blade-use alignment marks AM2 continuously. The processing in step S104 may be performed after the processing in step S105.

In step S106, it is determined whether the center position of the substrate CB is largely displaced from the center position of the vacuum chuck 69 by an amount exceeding a predetermined amount. When the center position of the substrate CB is at the center position of the vacuum chuck 69 almost accurately, the processing advances to step S107. On the other hand, when the center position of the substrate CB is largely displaced by an amount exceeding the predetermined amount, the processing advances to step S108.

In step S107, the moving guides 82 and the actuator 83 move the light blocking blade 86A and the light blocking blade 86B in the X-axis direction. A moving amount (distance) of the light blocking blade 86A and a moving amount (distance) of the light blocking blade 86B are equal, that is, the moving amount is a distance which the light blocking blade 86A and the light blocking blade 86B move to the reference position at which the light blocking blade 86A and the light blocking blade 86B form an annular shape. When positions of the light blocking blade 86A and the light blocking blade 86B calculated in step S105 are displaced from normal positions, the actuator 83 moves the light blocking blade 86A and the light blocking blade 86B to the reference position by taking into account an error caused by such displacement.

In step S108, the moving guides 82 and the actuator 83 move the light blocking blade 86A and the light blocking blade 86B in the X-axis direction by taking into account a displacement amount of the center position of the substrate CB from the center position of the vacuum chuck 69. In this embodiment, the positional accuracy of the conveyance arm 92 is low in the X-axis direction. Therefore, the moving amounts of the light blocking blade 86A and the light blocking blade 86B are adjusted to properly shield the peripheral portion of the substrate CB from light.

A state shown in FIG. 6B is a state taken in step S107 or in step S108.

In step S109, on the substrate CB, exposure is performed in conformity a pattern of the photomask M.

In step S110, the moving guides 82 and the actuator 83 retract the light blocking blade 86A and the light blocking blade 86B from an area above the substrate CB by moving the light blocking blade 86A and the light blocking blade 86B in the X-axis direction.

In step S111, the moving base 81 is lowered in the Z axis direction by the lifting guides 88 and the lifting actuator 89.

In step S112, the substrate lifter 68 is elevated so that the substrate CB is lifted from the vacuum chuck 69. The conveyance arm 92 enters a space formed below the substrate CB from the X-axis direction and, then, the substrate CB is unloaded.

In this embodiment, the substrate lifter 68 of the projection aligner 100 is elevated and lowered in the Z axis direction. Accordingly, the respective steps of the above-mentioned flowchart are taken. However, the first light blocking device 80 may be configured such that the substrate lifter 68 is fixed and the vacuum chuck 69 is elevated and lowered in the Z axis direction.

<Constitution of Light Blocking Blades 86>

Figure 7A:
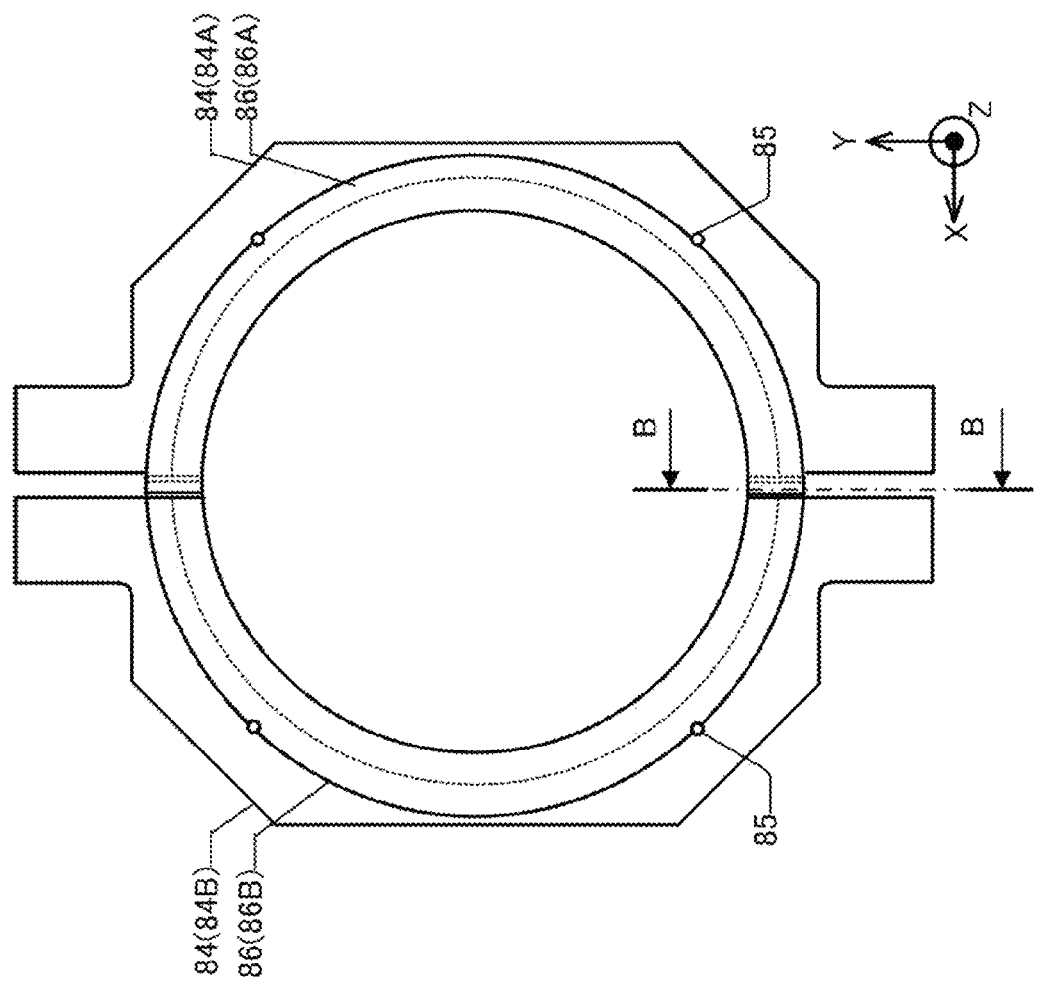
FIG. 7A is a view showing the light blocking blades 86 having an annular shape and a light blocking base.
Figure 7B:
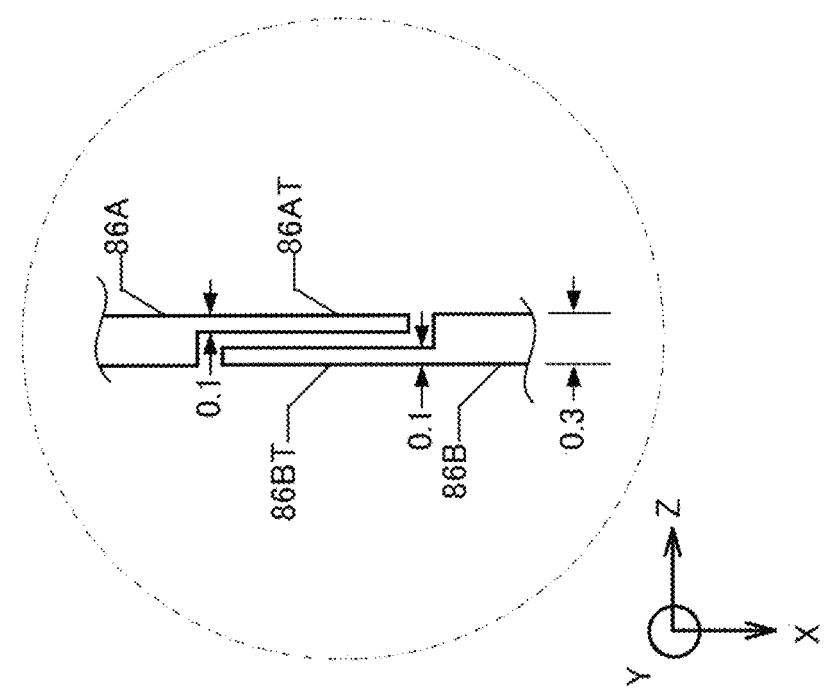
FIG. 7B is an enlarged cross-sectional view taken along a line B-B in FIG. 7A.

The constitution of the light blocking blades 86 is explained. As shown in FIG. 6B, the light blocking blade 86A and the light blocking blade 86B form an annular shape when the light blocking blade 86A and the light blocking blade 86B approach each other, and cover the peripheral portion of the substrate CB. FIG. 7A is a view showing the light blocking blades 86 having an annular shape and the light blocking base. FIG. 7B is an enlarged cross-sectional view taken along a line B-B in FIG. 7A.

As shown in FIG. 7A, the pair of light blocking blades 86 (86A, 86B) which is positioned by the positioning pins 85 is mounted on the pair of light blocking bases 84 (84A, 84B). The light blocking blade 86 is formed of a metal plate or a non-metal plate which is light in weight and has a high strength such as a stainless steel (SUS) plate, a titanium plate or a ceramics plate. A surface of the light blocking blade 86 is plated with black chromium or is subjected to a KEPLA-COAT (trade mark) treatment so that light resistance of the light blocking blade 86 is enhanced. The substrate CB usually has a circular shape and hence, the respective light blocking blades 86 have a semicircular opening portion.

When the light blocking blade 86A and the light blocking blade 86B approach each other, a distal end 86AT of the light blocking blade 86A and a distal end 86BT of the light blocking blade 86B overlap each other in the Z axis direction. As shown in FIG. 7B, a thickness of the light blocking blade 86A and a thickness of the light blocking blade 86B are approximately 0.3 mm, and the distal ends 86AT, 86BT are formed into a thin wall portion having a thickness of 0.1 mm. It is preferable that a thickness of the light blocking blade 86 (86A, 86B) be as small as possible for enabling the formation of a clear light blocking area at the time of exposure. It is particularly preferable that a thickness of the light blocking blade 86 is 0.5 mm or less. The distal end 86AT of the light blocking blade 86A is formed in the +Z axis direction and the distal end 86BT of the light blocking blade 86B is formed in the −Z axis direction and hence, the distal end 86AT and the distal end 86BT overlap each other without colliding with each other.

<Shape of Light Blocking Blade>

FIG. 8 shows modifications relating to a shape of a light blocking blade 86. A shape of the light blocking blade 86 in this embodiment can takes various shapes as described hereinafter.

Figure 8A:
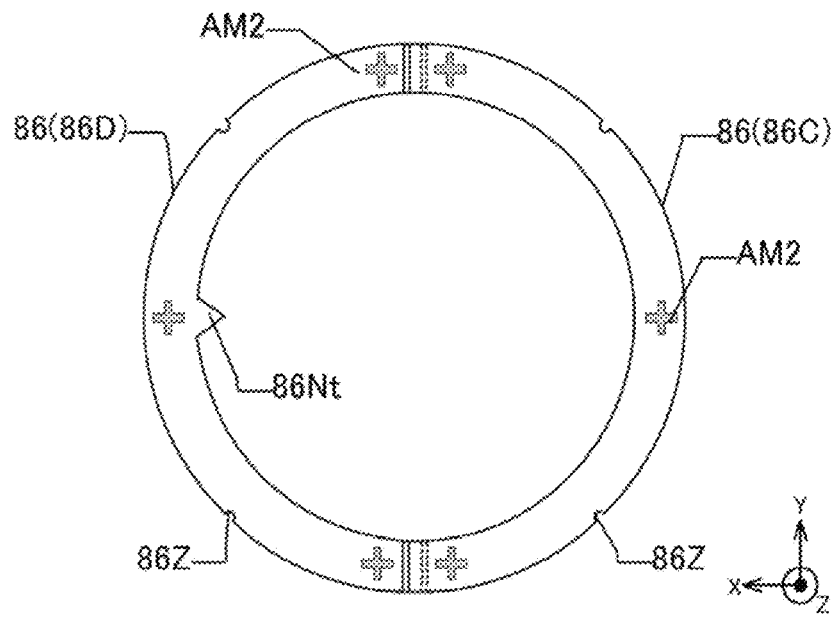
FIGS. 8A, 8B, 8C and 8D are views showing modifications relating to a shape of the light blocking blade.

A light blocking blade 86 shown in FIG. 8A is constituted of light blocking blades 86C, 86D. A light blocking portion 86Nt for a notch is formed on the light blocking blade 86C in conformity with a shape of a notch formed on a substrate CB.

Figure 8B:
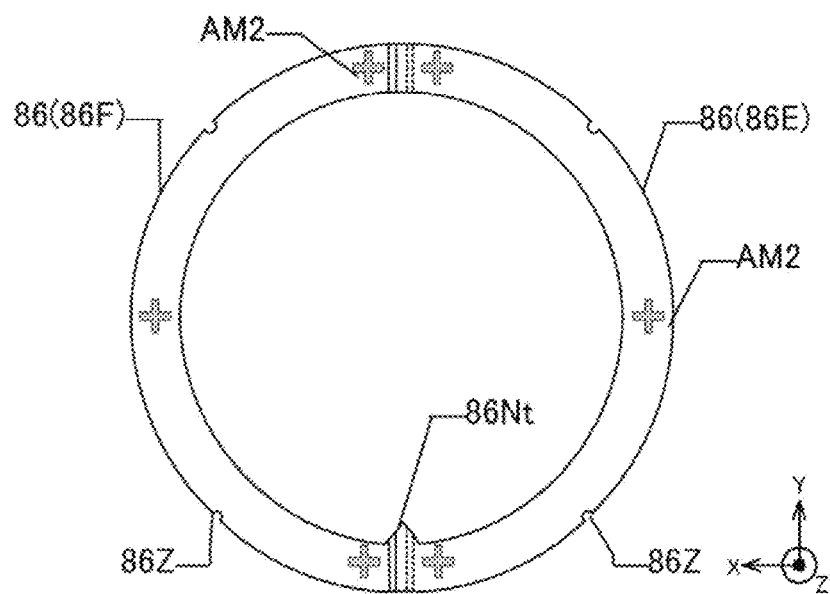

A light blocking blade 86 shown in FIG. 8B is constituted of light blocking blades 86E, 86F. A light blocking portion 86Nt for a notch is formed on one distal end of the light blocking blade 86E and one distal end of the light blocking blade 86F respectively in conformity with a shape of a notch formed on a substrate CB.

Figure 8C:
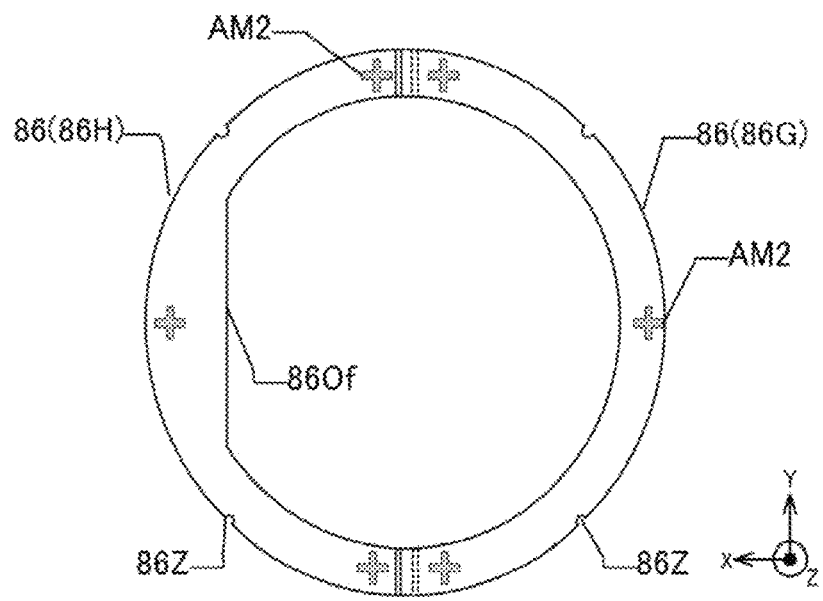

A light blocking blade 86 shown in FIG. 8C is constituted of light blocking blades 86G, 86H. A light blocking portion 86Of for an orientation flat portion is formed on the light blocking blade 86H in conformity with a shape of an orientation flat portion formed on a substrate CB.

Figure 8D:
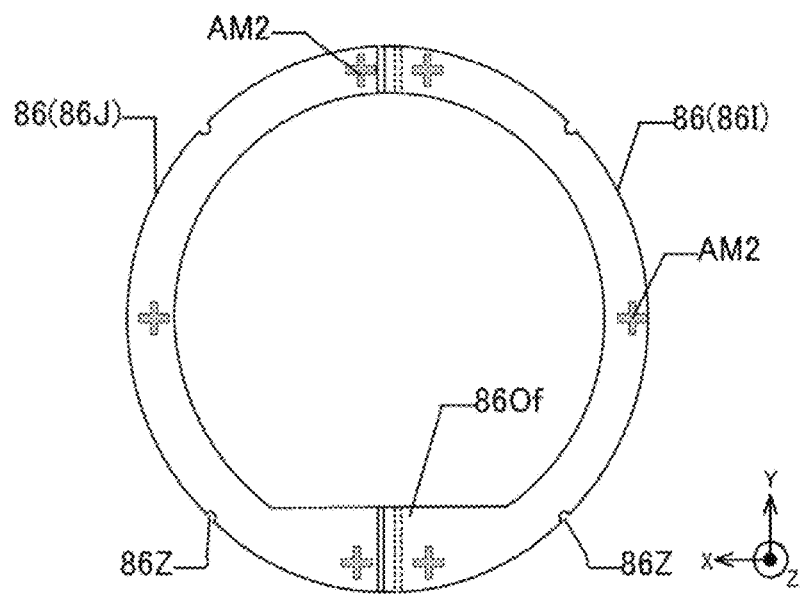

A light blocking blade 86 shown in FIG. 8D is constituted of light blocking blades 86I, 86J. A light blocking portion 86Of for an orientation flat portion is formed on one distal end of the light blocking blade 86I and one distal end of the light blocking blade 86J in conformity with a shape of an orientation flat portion formed on a substrate CB.

As described above, the shape of the light blocking blade 86 can be suitably changed in conformity with the shape of the substrate CB. Further, cutaway portions 86Z which are aligned with the positioning pins 85 (see FIG. 3 and FIG. 7) are formed on the respective light blocking blades 86 and hence, the shape of the light blocking blade 86 can be suitably changed in conformity with the shape of the substrate CB. Further, even when the light blocking blades 86 are not positioned by the positioning pins 85, the blade-use alignment marks AM2 are formed on the light blocking blades 86 and hence, the positions of the light blocking blades 86 can be surely grasped.

<Modification of Light Blocking Device>

Figure 9:
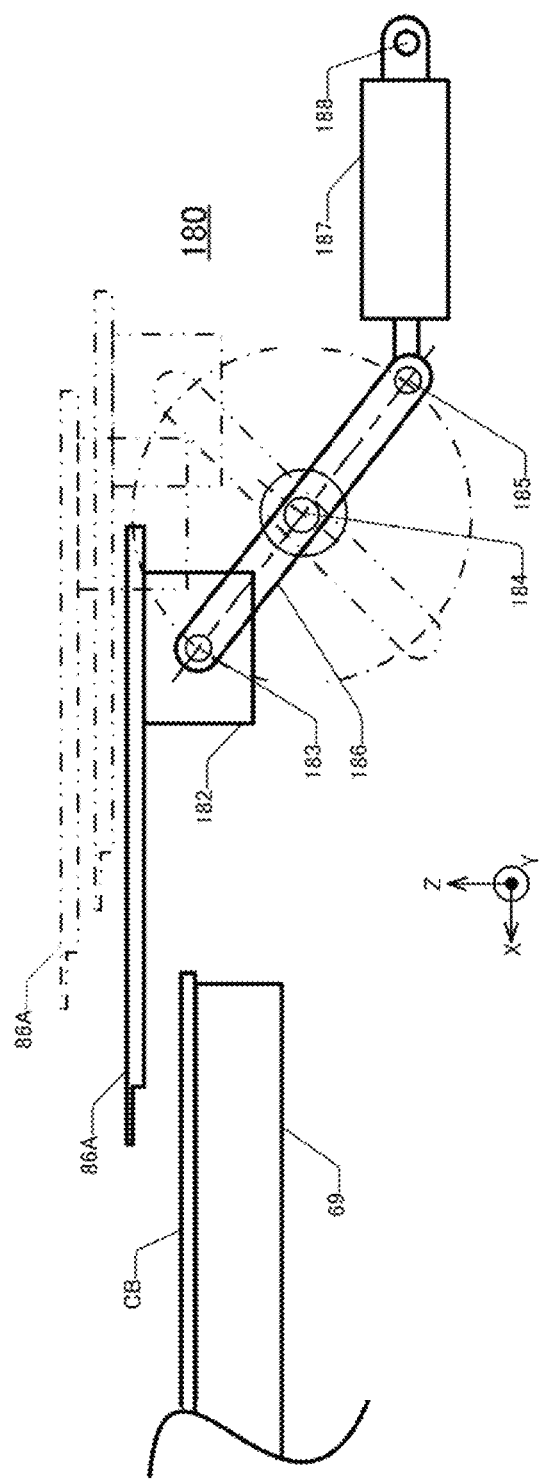
FIG. 9 is a view showing a second light blocking device 180.

FIG. 9 is a view showing a second light blocking device 180. In the first light blocking device 80 shown in FIG. 3 and FIG. 6, the light blocking blades 86 are elevated and lowered by elevating and lowering the moving base 81 in the Z axis direction, and the light blocking blades 86 are moved in the X-axis direction by moving the light blocking base 84 in the X-axis direction. In the second light blocking device 180, light blocking blades 86 are moved simultaneously in the Z axis direction as well as in the X-axis direction by a rotary mechanism which includes a rotary shaft extending in the Y-axis direction.

In the second light blocking device 180 shown in FIG. 9, only a light blocking blade 86A is shown. A light blocking blade 86B has the substantially same constitution as the light blocking blade 86A. The light blocking blade 86A is arranged on a light blocking base 182 while being positioned in place. The light blocking base 182 is mounted on a rotary arm 186 by way of a pin 183. An actuator 187 is also mounted on the rotary arm 186 by way of a pin 185. The rotary arm 186 is mounted in a rotatable manner about a rotary shaft 184. Also the actuator 187 is rotatable by way of a rotary pin 188.

When the rotary arm 186 is rotated by about a half turn about the rotary shaft 184 as indicated by a chained line, the light blocking blade 86A is elevated and lowered in the Z axis direction as indicated by a double-dashed chained line and is moved in the X-axis direction. The second light blocking device 180 makes the light blocking blade 86A cover the peripheral portion of the substrate CB or retract from the substrate CB by operating the light blocking blade 86A in such a manner.

Here, when the loaded substrate CB is displaced from the center of a vacuum chuck 69, the light blocking blade 86A is moved to the reference position by adjusting a drive amount of the actuator 187.

Figure 10:
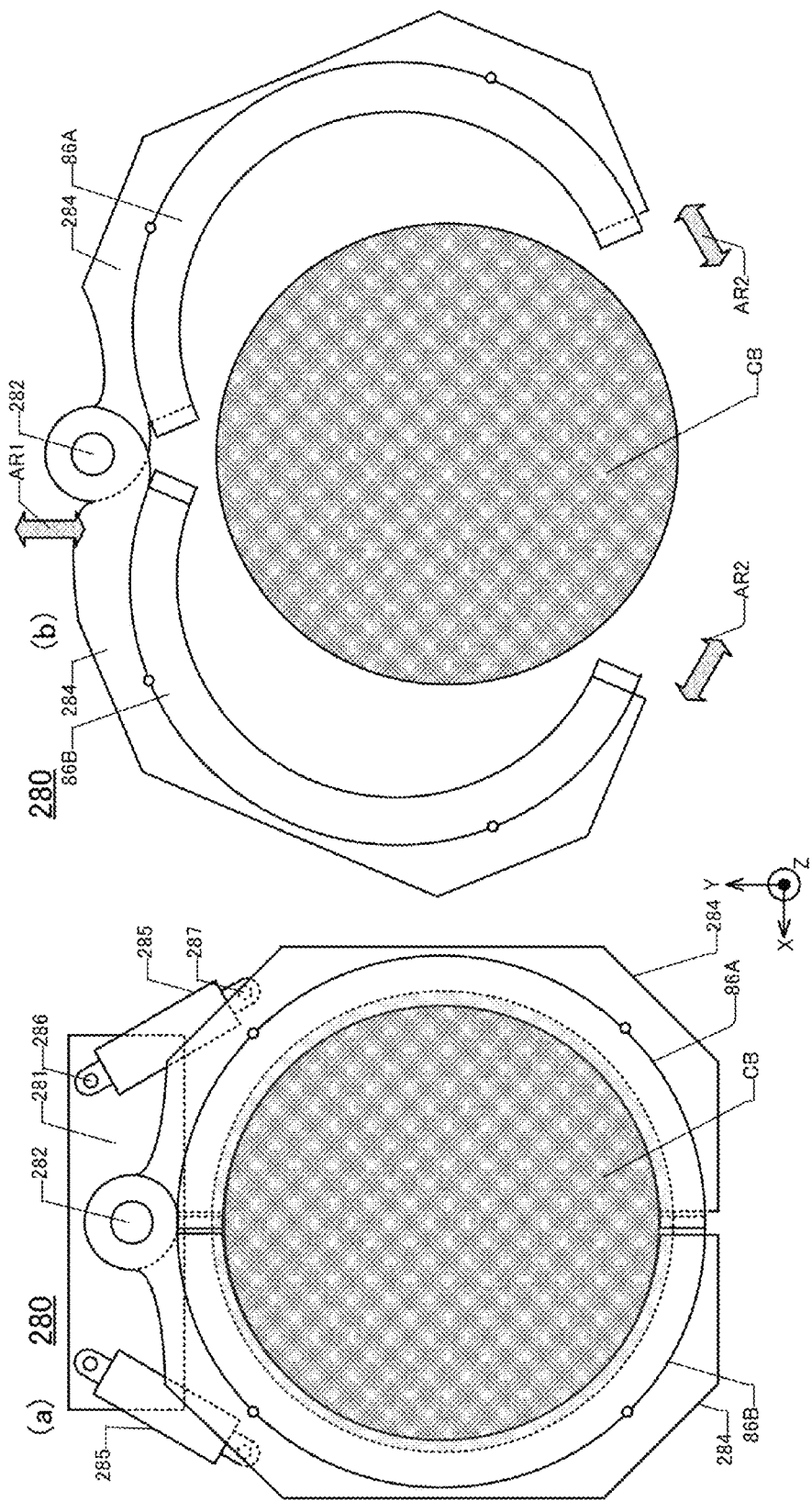
FIG. 10 is a view showing a third light blocking device 280.

FIG. 10 is a view showing a third light blocking device 280. The third light blocking device 280 moves light blocking blades 86 by a rotary mechanism which includes a rotary shaft extending in the Z axis direction.

As shown in FIG. 10A, the third light blocking device 280 includes a moving base 281, and a rotary shaft 282 and a pair of actuators 285 are arranged on the moving base 281. With respect to the pair of actuators 285, each actuator 285 has one end thereof connected to a pin 286 mounted on the moving base 281 and has the other end thereof connected to a pin 287 mounted on a light blocking base 284.

The moving base 281 is movable in the Y-axis direction by an actuator and guides not shown in the drawing. Further, a pair of light blocking bases 284 is rotatably mounted on the rotary shaft 282 of the moving base 281. The pair of light blocking bases 284 can be opened or closed along with the expansion or the shrinkage of the actuator 285.

Along with the movement of the moving base 281 in the Y-axis direction as indicated by an arrow AR1 in FIG. 10B, the light blocking blade 86A and the light blocking blade 86B retract from the substrate CB. Simultaneously, along with the shrinkage of the actuator 285, the light blocking blade 86A and the light blocking blade 86B are opened as indicated by an arrow AR2. The operation opposite to the above-mentioned operation is taken when the substrate CB is to be shielded from light.

When the loaded substrate CB is displaced from the center of the vacuum chuck 69, the light blocking blades 86A, 86B are moved to the reference position by adjusting a drive amount of the pair of actuators 285.

Thus, as described above, an operation of setting and changing the light blocking unit can be omitted from the exposure process if plural kinds of light blocking blades are prepared for each size of the substrates CB or each shape of the light blocking regions. The first light blocking device 80, the second light blocking device 180 and the third light blocking device 280 can be used properly by considering the displacement amount of the conveyance arm (robot) or other conditions.

The invention claimed is:

1. A projection aligner comprising:
  a projection optical system for radiating a luminous flux including ultraviolet rays onto a photomask and projecting said luminous flux passed through said photomask onto a substrate to which photoresist is applied;
  a substrate table for mounting said substrate; and
  a light blocking means for covering peripheral portion of said substrate to block luminous flux;
  said light blocking means including
    a first light blocking member and a second light blocking member each having a substantially semicircular opening, said first and second light blocking members forming an annular shape and having a size for covering the peripheral portion of said substrate when substantially semicircular openings approach each other; and
  moving means for moving said first light blocking member and said second light blocking member so as to approach each other and be away from each other;

said first light blocking member and said second light blocking member respectively having a first light blocking blade and a second light blocking blade for blocking said luminous flux, and a first light blocking base and a second light blocking base respectively provided with said first light blocking blade and said second light blocking blade;

said first light blocking blade and said second light blocking blade being removable corresponding to a size of said substrate;

said moving means having a moving base provided with a moving guide and an actuator;

one end of said first light blocking base and one end of said second light blocking base being each connected to said moving base so that a movement of said first light blocking base and said second light blocking base being guided and controlled by said moving guide driven by said actuator.

2. The projection aligner according to claim 1, wherein said substrate is loaded on said substrate table by a substrate conveyance means, and said moving means moves said first light blocking member and said second light blocking member so as to be moved straight in parallel with a direction where an accuracy of positioning is lower than other directions.

3. The projection aligner according to claim 1, wherein said first light blocking base and said second light blocking base are connected to a lifting means for moving said first light blocking base and said second light blocking base up and down.

4. The projection aligner according to claim 3, wherein said first light blocking blade and said second light blocking blade each have a distal end of thin portion so as to overlap each other in thickness direction as said first light blocking blade and said second light blocking blade approach each other.

5. A projection aligner comprising:
 a projection optical system for radiating a luminous flux including ultraviolet rays onto a photomask and projecting said luminous flux passed through said photomask onto a substrate to which photoresist is applied;
 a substrate table for mounting said substrate; and
 a light blocking means for covering peripheral portion of said substrate to block said luminous flux;
 said light blocking means including
  a first light blocking member and a second light blocking member each having a substantially semicircular opening and forming an annular shape and having a size for covering the peripheral portion of said substrate when said substantially semicircular openings approach each other; and
  moving means for moving said first light blocking member and said second light blocking member so as to approach each other and be away from each other;
 said first light blocking member and said second light blocking member respectively having a first light blocking blade and a second light blocking blade for blocking said luminous flux, and a first light blocking base and a second light blocking base respectively provided with said first light blocking blade and said second light blocking blade;
 said first light blocking blade and said second light blocking blade being removable corresponding to a size of said substrate;
 said moving means having a rotary shaft to which at least one end of said first light blocking base and said second light blocking base is fixed, and an actuator provided on at least one of said first light blocking base and said second light blocking base fixed to said rotary shaft, and said first light blocking member and said second light blocking member approach each other and be away from each other by rotating at least one of said first light blocking member and said second light blocking member about said rotary shaft by a drive of said actuator.

6. A projection exposure method for radiating a luminous flux including ultraviolet rays onto a photomask and blocking the luminous flux having passed through said photomask by a first light blocking means and a second light blocking means each having a substantially semicircular opening, forming an annular shape and covering a peripheral portion of a substrate when said substantially semicircular openings approach each other so that the peripheral portion of said substrate applied with photoresist being not irradiated with said luminous flux but a central portion where a center side from the peripheral portion being radiated,
 said first light blocking means and said second light blocking means respectively having a first light blocking blade and a second light blocking blade for blocking said luminous flux, said first light blocking blade and said second light blocking blade being removable corresponding to a size of said substrate, and a first light blocking base and a second light blocking base respectively provided with said first light blocking blade and said second light blocking blade,
 said projection exposure method comprising the steps of:
 preparing said first light blocking blade and said second light blocking blade corresponding to a size of said substrate by attaching said first light blocking blade and said second light blocking blade to said first light blocking base and said second light blocking base respectively;
 mounting said substrate on a substrate stage by a substrate convey means;
 arranging said first light blocking means and said second light blocking means above and closer to said substrate;
 calculating a position of said substrate mounted on said substrate stage by imaging at least one alignment mark on said substrate using an alignment camera;
 calculating positions of said first light blocking means and said second light blocking means by imaging at least one alignment mark on said first light blocking means and said second light blocking means using said alignment camera;
 moving said first light blocking means and said second light blocking means by an actuator to a reference position where said first light blocking means and said second light blocking means form an annular shape; and
 moving said first light blocking means and said second light blocking means to a position where a displacement is within a predetermined range in a case that said displacement of the position of said first light blocking means and said second light blocking means with respect to the position of said substrate is larger than said predetermined range based on a calculated position of said substrate and a calculated position of said first light blocking means and said second light blocking means.

7. The projection exposure method according to claim 6, wherein the position of said substrate is calculated by performing a global alignment of several alignment marks on said substrate, and the position of said first light blocking means and said second light blocking means is calculated by measuring at least one alignment mark provided at said first light blocking means and said second light blocking means.

* * * * *